(12) United States Patent
Andric et al.

(10) Patent No.: US 6,504,243 B1
(45) Date of Patent: Jan. 7, 2003

(54) REMOVABLE HEAT TRANSFER APPARATUS FOR A PIN GRID ARRAY (PGA) DEVICE, AND ASSOCIATED INSTALLATION AND REMOVAL METHODS

(75) Inventors: Anthony Andric, Austin, TX (US); Lewis M. Eyman, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/544,749

(22) Filed: Apr. 7, 2000

(51) Int. Cl.[7] .............................................. H01L 23/34
(52) U.S. Cl. ...................... 257/718; 257/706; 257/707; 257/719
(58) Field of Search ................................ 257/718–719, 257/706–707, 720

(56) References Cited

U.S. PATENT DOCUMENTS

| | | | |
|---|---|---|---|
| 5,357,404 A | | 10/1994 | Bright et al. |
| 5,552,635 A | * | 9/1996 | Kim ............................ 257/706 |
| 5,585,671 A | * | 12/1996 | Nagesh ........................ 257/697 |
| 5,594,624 A | | 1/1997 | Clemens et al. |
| 5,651,688 A | | 7/1997 | Lin |
| 5,745,344 A | * | 4/1998 | Baska ......................... 361/705 |
| 5,777,852 A | | 7/1998 | Bell |
| 5,847,928 A | * | 12/1998 | Hinshaw ...................... 361/704 |
| 5,850,691 A | | 12/1998 | Bell |
| 5,907,474 A | * | 5/1999 | Dolbear ....................... 257/706 |
| 5,990,552 A | | 11/1999 | Xie et al. |
| 6,108,207 A | * | 8/2000 | Lee ............................. 361/704 |

FOREIGN PATENT DOCUMENTS

DE  43 38 393  5/1995

OTHER PUBLICATIONS

International Search Report, application No. PCT/US 00/31962, mailed Apr. 26, 2001.

* cited by examiner

Primary Examiner—Olik Chaudhuri
Assistant Examiner—Nathan W. Ha
(74) Attorney, Agent, or Firm—B. Noël Kivlin

(57) ABSTRACT

A heat transfer apparatus is described for coupling to a pin grid array (PGA) device including an integrated circuit and mounted within a socket (e.g., a zero insertion force or ZIF socket). The socket is mounted upon a surface of a printed circuit board (PCB) and includes two latching projections extending from opposite side surfaces. The heat transfer apparatus includes a thermally conductive heat sink and a spring clip for holding the heat sink in position relative to the PGA device. The heat sink may be made from a metal (e.g., aluminum), and may have multiple structures (e.g., fins or pins) extending from an upper surface. The heat sink has an opening in an underside surface for housing the PGA device and the socket. The heat sink also has a lip surrounding the opening for thermally coupling to the PCB about the socket. The heat sink also has a pair of holes extending through the heat sink from the upper surface of the heat sink into the opening. The spring clip has two side members each adapted for attaching to a different one of the two latching projections of the socket. Each of the pair of holes in the heat sink is positioned to receive a different one of the side members of the spring clip. Methods for coupling a heat sink to the PGA device using the spring clip and removing the installed spring clip are also described.

27 Claims, 5 Drawing Sheets

REMOVABLE HEAT TRANSFER APPARATUS FOR A PIN GRID ARRAY (PGA) DEVICE, AND ASSOCIATED INSTALLATION AND REMOVAL METHODS

BACKGROUND OF THE INVENTION

1. Field of the Invention

This invention relates to electronic systems, and more particularly to heat transfer systems and devices used to transfer heat energy produced by a semiconductor device during operation to an ambient.

2. Description of the Related Art

Semiconductor devices (e.g., integrated circuits) dissipate electrical power during operation, transforming electrical energy into heat energy. At the same time, several key operating parameters of a semiconductor device typically vary with temperature, and reliable device operation within specifications occurs only within a defined operating temperature range. For high performance devices, such as microprocessors, specified performance is only achieved when the temperature of the device is below a specified maximum operating temperature. Operation of the device at a temperature above an upper limit of the operating temperature range (i.e., a maximum operating temperature) may result in irreversible damage to the device. In addition, it has been established that the reliability of a semiconductor device decreases with increasing operating temperature. The heat energy produced by a semiconductor device during operation must thus be removed to an ambient environment at a rate which ensures reliable operation.

Several different types of removable heat sinks are available for conveying heat energy generated within an integrated circuit housed within a pin grid array (PGA) package to a surrounding ambient. FIG. 1 is an exploded view of a known electronic apparatus 10 including a heat transfer apparatus 12 for coupling to a PGA device 14 positioned within a zero insertion force (ZIF) socket 16. PGA device 14 includes a PGA device package housing an integrated circuit (IC), and includes multiple pin terminals arranged across an underside surface providing input/output capability for the IC. Heat transfer apparatus 12 includes a heat sink 18 and a spring clip 20. An upper surface of heat sink 18 includes multiple pins projecting upwardly and arranged in rows. ZIF socket 16 includes multiple holes in an upper surface for receiving the pins of PGA device 14, a handle 22 along one side for operating an internal pin coupling mechanism, and multiple pin terminals arranged across an underside surface for coupling the pin terminals of PGA device 14 to electrically conductive traces of a printed circuit board.

As is common, ZIF socket 16 also includes two latching projections 24A and 24B extending outwardly from opposite side surfaces. Spring clip 20 has two apertures 26A and 26B dimensioned to allow respective latching projections 24A and 24B to pass therethrough. In an assembly operation, PGA device 14 is mounted upon the upper surface of ZIF socket 16. With handle 22 in a raised position, the pin terminals of PGA device 14 are inserted into corresponding holes in the upper surface of ZIF socket 16. Handle 22 is then lowered to actuate the internal pin coupling mechanism of ZIF socket 16.

With PGA device 14 positioned within ZIF socket 16, the underside surface of heat sink 18 is brought into thermal contact with the upper surface of PGA device 14. Spring clip 20 is then installed to hold heat sink 18 in place relative to PGA device 14 and to urge the underside surface of heat sink 18 toward the upper surface of PGA device 14. Spring clip 20 is installed by passing resilient bowed arms 28 of spring clip 20 between adjacent rows of pins on the upper surface of heat sink 18 such that apertures 26A and 26B are located directly above respective latching projections 24A and 24B. Sufficient downward pressure is then applied to portions of spring clip 20 above apertures 26A and 26B such that bowed arms 28 are deformed and latching projections 24A and 24B pass through respective apertures 26A and 26B. Following installation of spring clip 20, deformed bowed arms 28 exert a force between heat sink 18 and ZIF socket 16 which urges the underside surface of heat sink 18 toward the upper surface of PGA device 14.

It is now common to mount integrated circuits to substrates using the well known controlled collapse chip connection (C4) or "flip chip" techniques. Device packages including integrated circuits mounted to substrates using the flip chip method are commonly known as flip chip packages.

FIG. 2 will now be used to describe a problem which arises when PGA device 14 of FIG. 1 is a flip chip PGA device. FIG. 2 is a cross-sectional view of a known flip chip embodiment of PGA device 14 of FIG. 1. In the embodiment of FIG. 2, PGA device 14 includes an IC 32 mounted upon an upper surface of a substrate 34 using a flip chip technique, and a cover or lid 36 secured over IC 32. A layer 38 of a thermal interface material thermally couples an upward facing backside surface of IC 32 to an underside surface of lid 36. Lid 36 is attached (e.g., adhesively) to the upper surface of substrate 34 about outer edges of the upper surface of substrate 34, and at locations 40A and 40B in FIG. 2. Multiple solder bumps connect a set of I/O pads on a frontside surface of IC 32 to corresponding bonding pads on the upper surface of substrate 34. Substrate 34 includes multiple electrical conductors connecting pins 42 to bonding pads on the upper surface of substrate 12.

The area of the upper surface of lid 36 may be, for example, about 4 square inches. In contrast, the area of the backside surface of IC 32, thermally coupled to lid 36, may be about 0.3 square inches. Thus when the underside surface of heat sink 18 (FIG. 1) is thermally coupled to the upper surface of lid 36, the effectiveness of the transfer of heat energy from IC 32 to heat sink 18 is heavily dependent upon the thermal resistance, and the heat spreading ability, of lid 36. Further, a substantial amount of the heat energy generated within IC 32 is conducted into substrate 34. For heat energy within substrate 34 to reach heat sink 18 (FIG. 1), the heat energy must travel through the attachment points between substrate 34 and lid 36 about the outer edges of the upper surface of substrate 34, and at locations 40A and 40B in FIG. 2. Heat transfer paths between a portion of substrate 34 adjacent to IC 32 and the heat sink are thus relatively long, and include substantial distances within substrate 34. As a result, the effectiveness of the transfer of heat energy from substrate 34 to heat sink 18 is heavily dependent upon the thermal resistance of substrate 34, as well as the rather uncertain thermal resistances at the attachment points between substrate 34 and lid 36.

It would thus be desirable to have a heat removal apparatus for a flip chip PGA device including a heat sink in more effective thermal communication with both the IC and the substrate of the flip chip PGA device. The desired heat removal apparatus would more effectively remove heat energy both from the IC and the substrate, thereby increasing the reliability of the PGA device.

SUMMARY OF THE INVENTION

A heat transfer apparatus is described for coupling to a pin grid array (PGA) device including an integrated circuit and mounted within a socket (e.g., a zero insertion force or ZIF socket). The socket is mounted upon a surface of a printed circuit board (PCB) and includes two latching projections extending from opposite side surfaces. The heat transfer apparatus includes a thermally conductive heat sink and a spring clip for holding the heat sink in position relative to the PGA device. The heat sink may be made from a metal (e.g., aluminum), and may have multiple structures (e.g., fins or pins) extending from an upper surface.

The heat sink has an opening in an underside surface for housing the PGA device and the socket. The heat sink also has a lip surrounding the opening for thermally coupling to the PCB about the socket. The heat sink also has a pair of holes extending through the heat sink from the upper surface of the heat sink into the opening. The spring clip has two side members each adapted for attaching to a different one of the two latching projections of the socket. Each of the pair of holes in the heat sink is positioned to receive a different one of the side members of the spring clip. For example, the holes in the heat sink may be separated by a distance equal to a distance between the latching projections of the socket.

In one embodiment, the PGA device includes a substrate having a substantially flat upper surface opposite the socket. The integrated circuit of the PGA device is mounted upon the upper surface of the substrate such that the integrated circuit is elevationally raised above the upper surface of the substrate. In this case, the opening in the underside of the heat sink includes a first cavity dimensioned to receive the socket and the substrate of the PGA device. The first cavity has an upper wall, and the opening also includes a second cavity in the upper wall of the first cavity. The second cavity is dimensioned to receive the integrated circuit.

The heat transfer may include a first thermal interface layer positioned between the integrated circuit and an upper wall of the second cavity. The heat transfer apparatus may also include a second thermal interface layer positioned between a region of the upper surface of the substrate surrounding the integrated circuit and an adjoining portion of the upper wall of the first cavity. The heat transfer apparatus may also include a third thermal interface layer positioned about the socket between the lip of the heat sink and the surface of the PCB.

The spring clip may include a joining member connected between the two side members. The joining member may be made from a resilient material (e.g., spring steel). In one embodiment, the joining member has two ends and a bowed center section between the two ends. The two ends of the joining member are substantially parallel to one another. Each side member of the spring clip has an upper end and a lower end, and a hole in the lower end dimensioned to allow a corresponding one of the latching projections of the socket to pass therethrough. One of the two ends of the joining member is connected to the upper end of one of the side members, and the other end of the joining member is connected to the upper end of the other side member. The center section of the joining member is bowed toward the lower ends of the side members such that the spring clip is substantially "M"-shaped.

The latching projections of the socket may be substantially rectangular. In this case, the holes in the lower ends of the side members of the spring clip may also be rectangular.

The spring clip may be formed from a single piece of resilient material (e.g., spring steel). In this case, the spring clip may have sharp bends at interfaces between the side members and the joining member.

A method for coupling the heat sink to the PGA device includes positioning the heat sink over the PGA device and the socket such that the PGA device and the socket reside in the opening in the underside surface of the heat sink. The lower ends of the two side members of the spring clip are inserted into the holes in the heat sink. The side members of the spring clip are pushed downward along the opposite side surfaces of the socket until the latching projections of the socket pass through the corresponding holes in the lower ends of the side members.

A method for removing the spring clip holding the heat sink in position includes exerting a force between upper ends of two side members extending from the holes in the heat sink. The force causes the upper ends of the two side members to move toward one another, and the lower ends of the side members to move away from one another. The moving of the lower ends away from one another allows the latching projections of the socket to exit the holes in the lower ends of the side members, thus detaching the spring clip from the socket.

BRIEF DESCRIPTION OF THE DRAWINGS

Other objects and advantages of the invention will become apparent upon reading the following detailed description and upon reference to the accompanying drawings in which.

Figure 1:
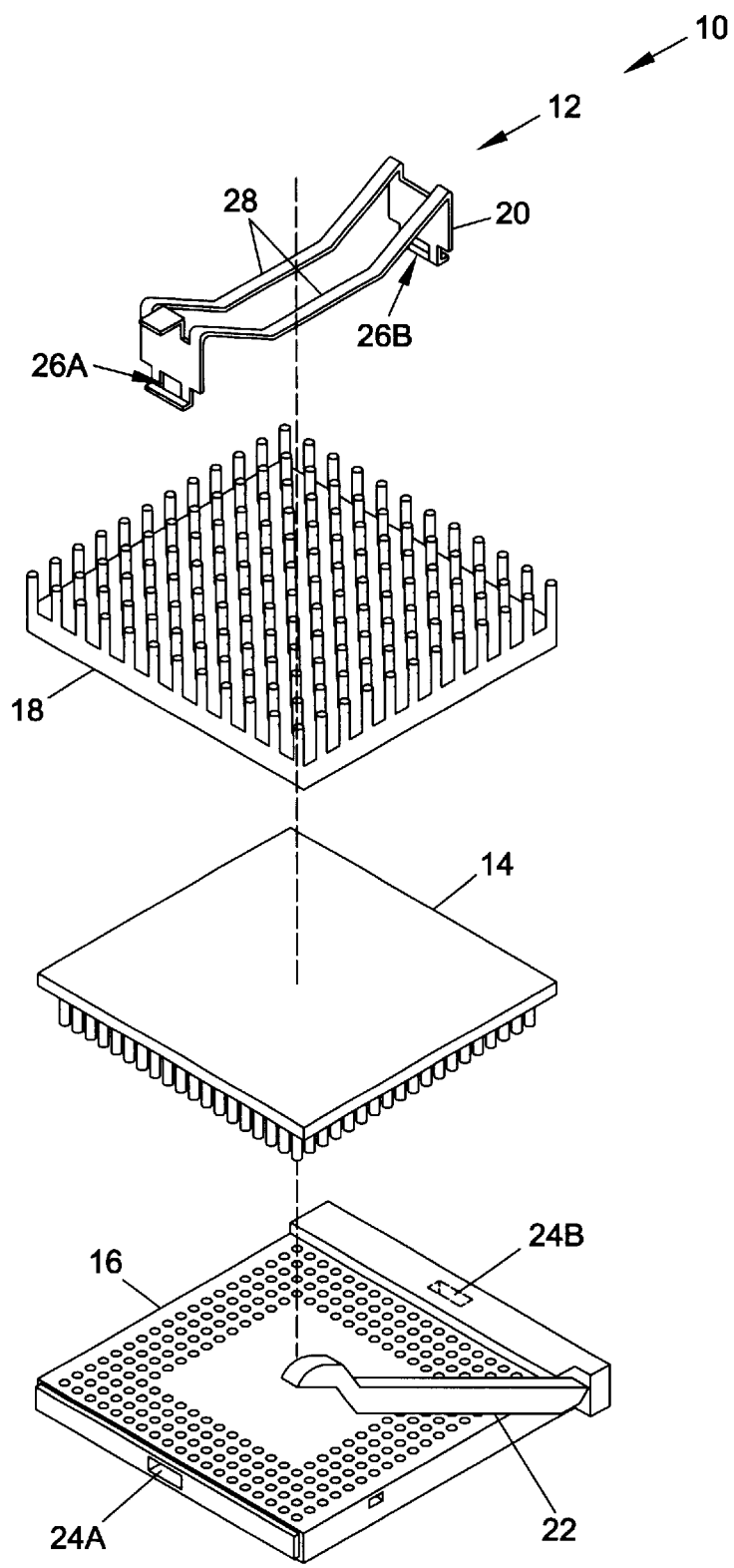
FIG. 1 is an exploded view of a known electronic apparatus including a heat transfer apparatus for coupling to a PGA device positioned within a zero insertion force (ZIF) socket.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
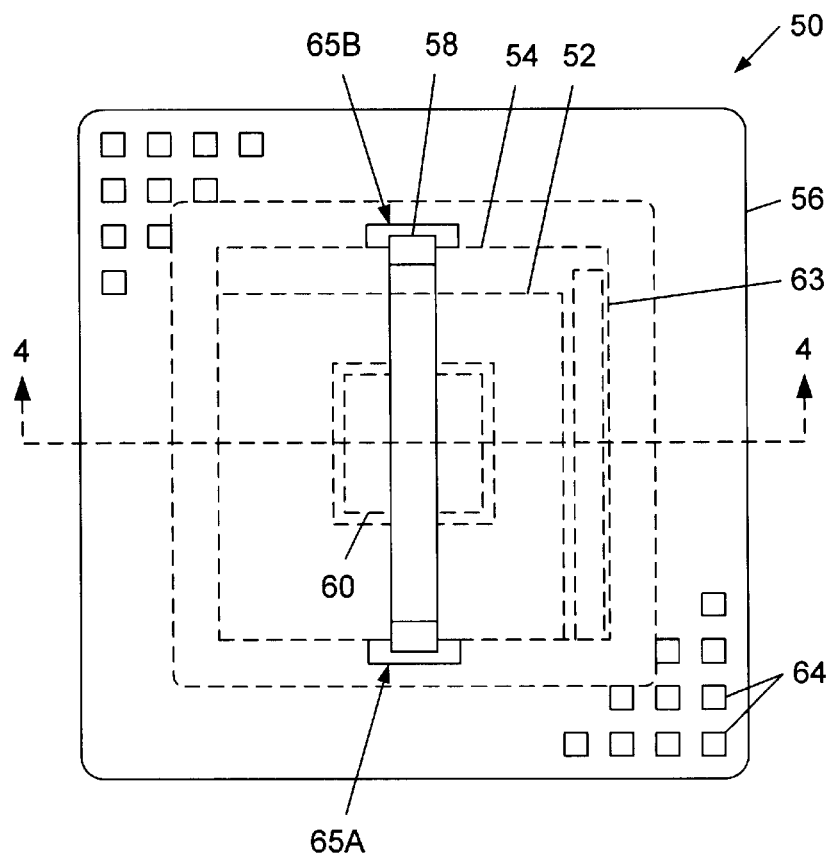
FIG. 3 is a top plan view of a heat transfer apparatus coupled to a flip chip PGA device positioned within a zero insertion force (ZIF) socket, wherein the heat transfer apparatus includes a heat sink held in place by a spring clip.
Figure 4:
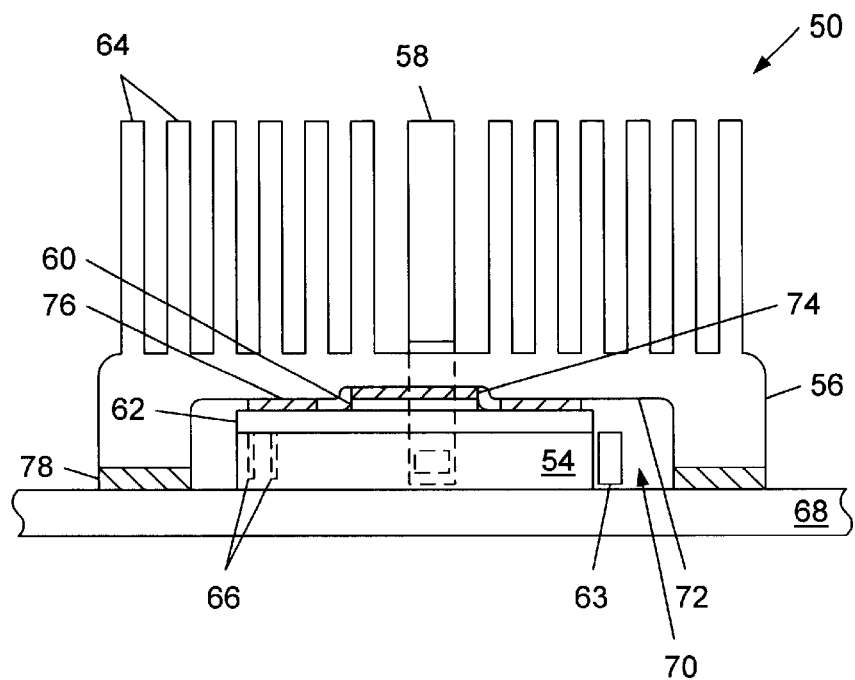
FIG. 4 is a cross-sectional view of the heat transfer apparatus of FIG. 3.

FIGS. 3 and 4 will now be used to illustrate one embodiment of a heat transfer apparatus 50 for coupling to a flip chip pin grid array (PGA) device 52, wherein flip chip PGA device 52 is positioned within a zero insertion force (ZIF) socket 54. FIG. 3 is a top plan view of heat transfer apparatus 50 coupled to PGA device 52, and FIG. 4 is a cross-sectional view of heat transfer apparatus 50 as indicated in FIG. 3. Flip chip PGA device 52 includes an integrated circuit (IC) 60 mounted upon a substantially flat upper surface of a substrate 62 such that IC 60 is elevationally raised above the upper surface of substrate 62. Heat transfer apparatus 50 includes a heat sink 56 and a spring clip 58, and is used to transfer heat energy from IC 60, substrate 62, and a printed circuit board to which ZIF socket 54 is mounted, to an ambient surrounding heat transfer apparatus 50. Heat sink 56 has multiple pins 64 extending upwardly from an upper surface.

ZIF socket 54 includes an internal pin coupling mechanism for coupling pins 66 of PGA device 52 to corresponding pins of ZIF socket 54. The pin coupling mechanism is actuated by a handle 63 along one side of ZIF socket 54. With handle 63 in a raised position, pins 66 of PGA device 52 are inserted into the corresponding holes in the upper surface of ZIF socket 54. Handle 63 is then lowered to actuate the internal pin coupling mechanism, thereby coupling pins 66 of PGA device 52 to corresponding pins of ZIF socket 54, and to corresponding traces of PCB 68.

Substrate 62 of PGA device 52 has multiple pins 66 extending downwardly from an underside surface. Pins 66 provide input/output capability for IC 60. PGA device 52 is positioned within ZIF socket 54 such that pins 66 extend into corresponding holes in an upper surface of ZIF socket 54. As indicated in FIG. 4, ZIF socket 54 is mounted upon a surface of a printed circuit board (PCB) 68. ZIF socket 54 may have, for example, pins extending from an underside surface and coupled to corresponding electrically conductive traces of PCB 68. The pins of ZIF socket 54 may extend into corresponding holes in PCB 68.

ZIF socket 54 includes an internal pin coupling mechanism for coupling pins 66 of PGA device 52 to corresponding pins of ZIF socket 54. The pin coupling mechanism is actuated by a handle 63 along one side of ZIF socket 54. With handle 63 in a raised position, pins 66 of PGA device 52 are inserted into the corresponding holes in the upper surface of ZIF socket 54. Handle 63 is then lowered to actuate the internal pin coupling mechanism, thereby coupling pins 66 of PGA device 52 to corresponding pins of ZIF socket 54, and to corresponding traces of PCB 64.

Figure 5:
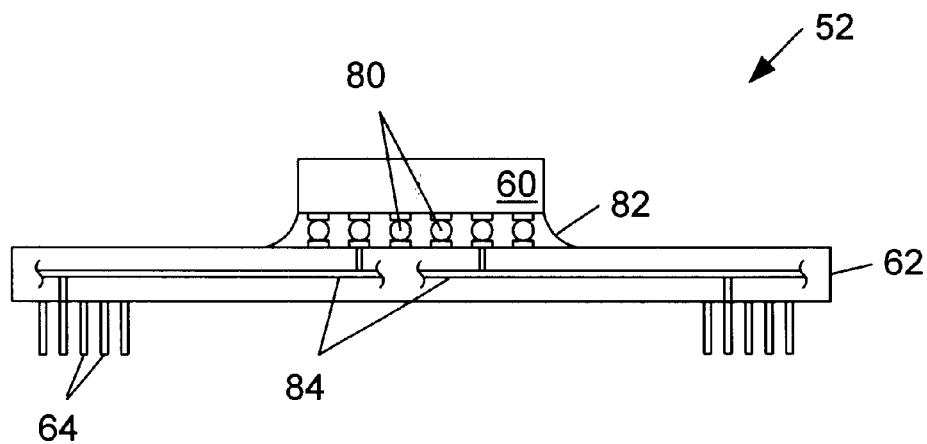
FIG. 5 is a cross-sectional view of the flip chip PGA device of FIGS. 3 and 4.

FIG. 5 is a cross-sectional view of flip chip PGA device 52 of FIGS. 3 and 4. IC 60 is mounted upon a center portion of the upper surface of substrate 62 using the flip chip method. Multiple solder bumps 80 connect a set of I/O pads on a frontside surface of IC 60 to corresponding bonding pads on the upper surface of substrate 62. A layer 82 of an "underfill" material seals the flip chip connections and provides other mechanical advantages. Substrate 62 includes multiple electrical conductors 84 connecting pins 64 to bonding pads on the upper surface of substrate 62. Electrical conductors 84 may be disposed in a stacked arrangement within substrate 62. As evident in FIGS. 4 and 5, an upward facing backside surface of IC 60 is at a higher elevation relative to the upper surface of substrate 62.

As shown in FIGS. 3 and 4, heat sink 56 is positioned between PGA device 52 and the ambient during use, and held in place by spring clip 58. Heat sink 56 is made out of a thermally conductive material (e.g., aluminum). As shown in FIG. 4, an underside surface of heat sink 56 has a cavity 70 dimensioned to receive ZIF socket 54 with flip ship PGA device 52 mounted thereon. Cavity 70 includes a substantially flat upper wall 72. Upper wall 72 has a cavity dimensioned to receive IC 60 of PGA device 52. During use of heat transfer apparatus 50, ZIF socket 54 and substrate 62 of PGA device 52 are positioned within cavity 70 as shown in FIG. 4, and IC 60 of PGA device 52 is positioned within the cavity in upper wall 72 as shown in FIG. 4. The remaining portion of the underside surface of heat sink 56 forms a lip surrounding a mouth of cavity 70.

Referring to FIG. 4, heat transfer apparatus 50 may also include a first thermal interface layer 74 positioned between the upward facing backside surface of IC 60 and an upper wall of the cavity dimensioned to receive IC 60. Thermal interface layer 74 thermally couples IC 60 to heat sink 56. First thermal interface layer 74 is preferably made of a material which changes phase (i.e., flows) to fill air pockets between IC 60 and heat sink 56, and to fill microscopic irregularities in contacted surfaces of IC 60 and heat sink 56, under a relatively small amount of pressure applied between heat sink 56 and PGA device 52. First thermal interface layer 74 thus achieves an acceptably low value of thermal resistance between IC 60 and heat sink 56 under a relatively small amount of pressure applied between heat sink 56 and PGA device 52.

First thermal interface layer 74 may be, for example, a layer of thermal grease or thermal wax. Thermal greases contain particles of thermally conductive material (e.g., ceramic particles) suspended in a viscous silicone or hydrocarbon fluid base. Thermal waxes contain thermally conductive particles suspended in a wax base. A suitable thermal wax is the THERMFLOW™ T725 thermal wax (Chomerics Co., Woburn, Mass.). Alternately, first thermal interface layer 74 may be a piece of thermal interface tape or a thermal interface pad which changes phase to fill air pockets and microscopic irregularities under a relatively small amount of pressure. A suitable thermal interface tape is the THERMATTACH™ T412 thermal interface tape (Chomerics Co., Woburn, Mass.).

Figure 2:
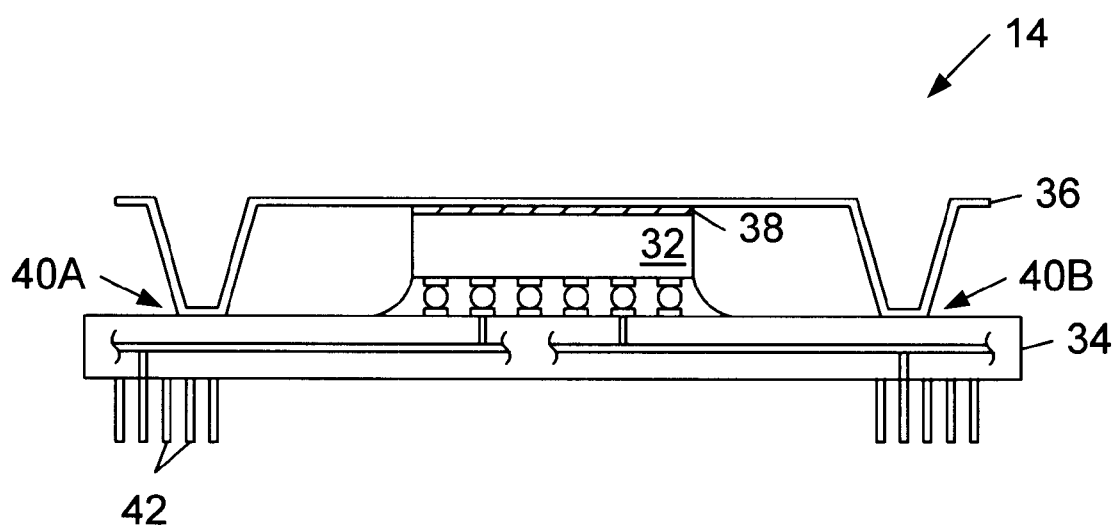
FIG. 2 is a cross-sectional view of a known flip chip embodiment of the PGA device of FIG. 1.

Heat transfer apparatus 50 may also include a second thermal interface layer 76 positioned between a region of the upper surface of substrate 62 surrounding IC 60 and the adjoining portion of upper wall 72 of cavity 70. Thermal interface layer 76 thermally couples substrate 62 to heat sink 56 adjacent to IC 60. Heat transfer paths between a portion of substrate 34 adjacent to IC 60 and heat sink 56 are thus relatively short compared to those of FIG. 2. Second thermal interface layer 76 is preferably made of a material which changes phase (i.e., flows) to fill air pockets between the upper surface of substrate 62 and upper wall 72 of cavity 70, and to fill microscopic irregularities in the upper surface of substrate 62 and the surface of upper wall 72, under a relatively small amount of pressure applied between heat sink 56 and PGA device 52. Second thermal interface layer 76 thus achieves an acceptably low value of thermal resistance between the upper surface of substrate 62 and the surface of upper wall 72 under a relatively small amount of pressure applied between heat sink 56 and PGA device 52.

Second thermal interface layer 76 may be, for example, a layer of thermal grease or thermal wax. Thermal greases contain particles of thermally conductive material (e.g., ceramic particles) suspended in a viscous silicone or hydrocarbon fluid base. Thermal waxes contain thermally conductive particles suspended in a wax base. A suitable thermal wax is the THERMFLOW™ T725 thermal wax (Chomerics Co., Woburn, Mass.). Alternately, second thermal interface layer 76 may be a piece of thermal interface tape or a thermal interface pad which changes phase to fill air pockets and microscopic irregularities under a relatively small amount of pressure. A suitable thermal interface tape is the THERMATTACH™ T412 thermal interface tape (Chomerics Co., Woburn, Mass.).

Heat transfer apparatus 50 may also include a third thermal interface layer 78 positioned between the underside surface of heat sink 56, forming the lip around the mouth of cavity 70, and a region of the surface of PCB 68 surrounding ZIF socket 54. Thermal interface layer 78 thermally couples PCB 68 to heat sink 56 adjacent to ZIF socket 54. Thermal interface layer 78 also forms a seal between the underside surface of heat sink 56 (i.e., the lip surrounding cavity 70) and PCB 68, preventing foreign substances (e.g., water, sand, and dust) from entering cavity 70. Thermal interface layer 78 is preferably made of a thermally conductive, complaint material which changes shape in an elastic manner when subjected to mechanical force (i.e., under pressure). Thermal interface layer 78 may be, for example, a layer of a thermal gap filler including ceramic particles dispersed in an elastomeric binder. Thermal interface layer 78 may be, for example, a layer of V-THERM™ thermally conductive elastomer (Chomerics Co., Woburn, Mass.).

Compared to heat sink 18 of heat transfer apparatus 12 of FIG. 1, heat sink 56 of heat transfer apparatus 50 is in more effective thermal communication with both the IC and the substrate of a flip chip PGA device. Heat transfer apparatus 50 thus more effectively removes heat energy from IC 60 and substrate 62, expectantly increasing the reliability of PGA device 52 over heat transfer system 12. Further, by thermally coupling PCB 68 to heat sink 56, heat energy conducted into PCB 68 from substrate 62 and ZIF socket 54 may be removed to the ambient by heat sink 56, thereby expectantly increasing the reliability of PCB 68 and components mounted thereto.

Figure 6:
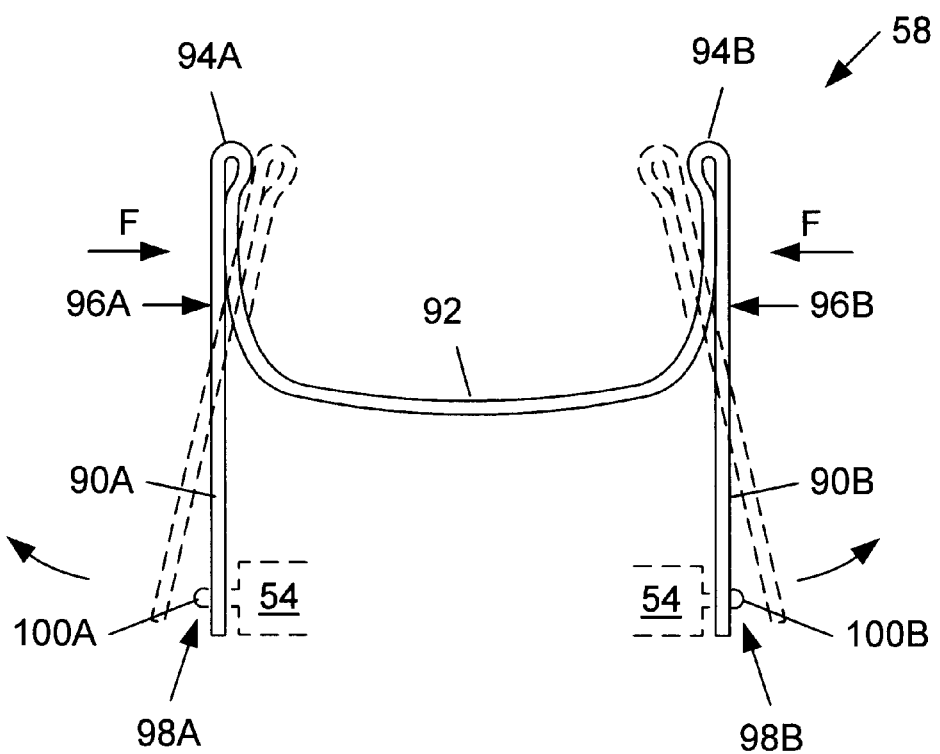
FIG. 6 is a side elevation view of one embodiment of the spring clip of FIGS. 3–4, wherein the spring clip includes two side members connected by a joining member, and wherein each of the two side members has a hole in a lower end for receiving a latching projection of the ZIF socket.

FIG. 6 is a side elevation view of one embodiment of spring clip 58 of FIGS. 3–4. In the embodiment of FIG. 6, spring clip 58 is substantially "M"-shaped, and includes two side members 90A and 90B joined by a joining member 92 having two ends and a bowed center section. As illustrated in FIG. 6, spring clip 58 is preferably made from a single piece of resilient material (e.g., spring steel). In this case, spring clip 58 has two sharp bends 94A and 94B at junctions between side members 90A and 90B and joining member 92 where the resilient material is bent back over itself. The two ends of joining member 92 are substantially parallel to one another. As illustrated in FIG. 6, one upward pointing end of joining member 92 is preferably in contact with an upper end of side member 90A, and the other upward pointing end of joining member 92 is preferably in contact with an upper end of side member 90B. The bowed center section of joining member 92 diverges from the side members at points 96A and 96B as illustrated in FIG. 6. Side members 90A and 90B have respective holes 98A and 98B in lower ends.

Figure 7:
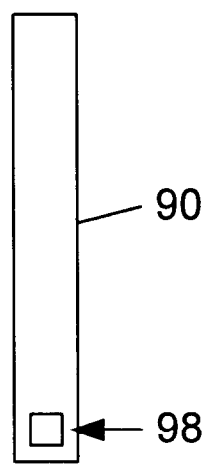
FIG. 7 is a side elevation view of one of the side members of the spring clip of FIG. 6 illustrating one embodiment of the hole in the lower end of the side member, wherein the hole is rectangular and dimensioned to receive a rectangular latching projection.

FIG. 7 is a side elevation view of one of the side members 90 of spring clip 58 of FIG. 6 illustrating one embodiment of hole 98 in the lower end of the side member 90. As illustrated in FIG. 6 and described above, ZIF socket 54 includes two latching projections 100A and 100B extending outwardly from opposite side surfaces of ZIF socket 54. Holes 98A and 98B in respective side members 90A and 90B are dimensioned to allow respective latching projections 100A and 100B to pass therethrough. In the embodiment of FIG. 7, hole 98 is rectangular and dimensioned to receive a rectangular latching projection 100.

Referring to FIGS. 3 and 6, heat sink 56 has two holes 65A and 65B positioned and dimensioned to receive respective side members 90A and 90B of spring clip 58. When spring clip 58 is installed such that latching projections 100A and 100B of ZIF socket 54 pass through respective holes 98A and 98B in respective side members 90A and 90B of spring clip 58, the bowed center section of joining member 92 of spring clip 58 is deformed, and exerts a force between heat sink 56 and ZIF socket 54. As PGA device 52 is positioned between heat sink 56 and ZIF socket 54 and fixed relative to ZIF socket 54, the force exerted by spring clip 58 between heat sink 56 and ZIF socket 54 urges heat sink 56 toward PGA device 52. As described above, spring clip 58 serves hold heat sink 56 in place relative to PGA device 52 and to urge heat sink 56 toward PGA device 52.

Figure 8:
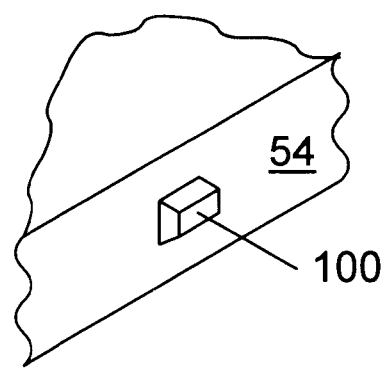
FIG. 8 is a perspective view of one embodiment of the latching projections of FIG. 6, wherein each latching projection is substantially rectangular and has a downward sloping upper surface which facilitates installation of the spring clip.

FIG. 8 is a perspective view of one embodiment of the latching projections 100 of FIG. 6. In the embodiment of FIG. 8, each latching projection 100 is substantially rectangular and has a downward sloping upper surface which facilitates installation of spring clip 58.

During installation of heat transfer apparatus 50, first thermal interface layer 74 may be formed upon the upper wall of the cavity of heat sink 56 dimensioned to receive IC 60 of PGA device 52. Alternately, first thermal interface layer 74 may be formed upon the upper surface of IC 60. Similarly, second thermal interface layer 76 may be formed upon upper wall 72 of cavity 70 of heat sink 56 in the location expected to adjoin the region of the upper surface of substrate 62 surrounding IC 60. Alternately, second thermal interface layer 76 may be formed upon the region of the upper surface of substrate 62 surrounding IC 60. Third thermal interface layer 78 may be positioned between the underside surface of heat sink 56 and PCB 68. Heat sink 56 is positioned about PGA device 52, located within ZIF socket 54, as shown in FIGS. 3–4 such that holes 65A and 65B extending through heat sink 56 are vertically aligned over latching projections 100A and 100B of ZIF socket 54.

Figure 9:
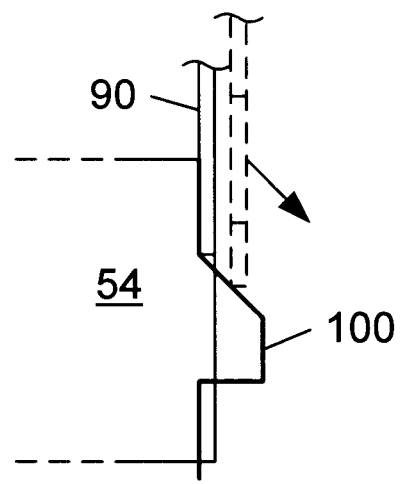
FIG. 9 is a side elevation view of a side member of the spring clip of FIG. 6 being attached to a latching projection of the ZIF socket.

Spring clip 58 is then installed to hold heat sink 56 in place relative to PGA device 52 and to urge heat sink 56 toward PGA device 52. The lower ends of side members 90A and 90B of spring clip 58 are inserted into respective holes 65A and 65B. As illustrated in FIG. 9, side members 90A and 90B of spring clip 58 are pushed downward along the side surfaces of ZIF socket 54 and the upper surfaces of respective latching projections 100A and 100B until latching projections 100A and 100B pass through respective holes 98A and 98B in respective side members 90A and 90B. The bowed center section of joining member 92 of spring clip 58 is deformed during the installation process as described above, exerting a force between heat sink 56 and ZIF socket 54 which urges heat sink 56 toward PGA device 52 following installation.

Once installed, removal of heat sink 56 requires removing of spring clip 58. Referring to FIG. 6, spring clip 58 may be removed by exerting a force F between the upper ends of side members 90A and 90B. Force F causes the upper ends of side members 90A and 90B to move toward each other. Side members 90A and 90b pivot about respective points 96A and 96B as illustrated in FIG. 6. The lower ends of side members 90A and 90B swing outwardly away from each other, allowing latching projections 100A and 100B to exit respective holes 98A and 98B in respective side members 90A and 90B. Side members 90A and 90B of spring clip 58 may then be extracted from corresponding holes 65A and 65B in heat sink 56. Once spring clip 58 is removed, the other components of heat transfer apparatus 50 may be removed.

It is noted that utility of heat transfer apparatus 50 is not limited to embodiments where PGA device 52 is a flip chip PGA device and socket 54 is a ZIF socket. For example, as heat sink 56 is thermally coupled to PCB 68 about socket 54, heat transfer apparatus 50 may also be useful for removing heat energy from a PGA device having a substantially flat upper surface (e.g., PGA device 14 in FIGS. 1 and 2). In this case, heat sink 56 may have a single cavity for receiving the PGA device and socket 54, and a single thermal interface layer may be used to couple the upper surface of the PGA device to an upper wall of the single cavity of heat sink 56. Further, heat transfer apparatus 50 may also be useful for removing heat energy from a PGA device positioned in, for example, a low insertion force (LIF) socket having latching projections extending outwardly from opposite side surfaces.

Numerous variations and modifications will become apparent to those skilled in the art once the above disclosure is fully appreciated. It is intended that the following claims be interpreted to embrace all such variations and modifications.

What is claimed is:

1. A heat transfer apparatus for coupling to a pin grid array (PGA) device including an integrated circuit and mounted within a socket, wherein the socket is mounted upon a surface of a printed circuit board (PCB) and comprises two latching projections extending from opposite side surfaces, the heat transfer apparatus comprising:
    a thermally conductive heat sink, comprising:
        an opening in an underside surface for housing the PGA device and the socket;
        a lip surrounding the opening for thermally coupling to the PCB about the socket;
        a pair of holes extending through the heat sink from an upper surface of the heat sink into the opening;
    a spring clip for holding the heat sink in place relative to the PGA device, wherein the spring clip comprises two side members, and wherein each side member is adapted for attaching to a different one of the latching projections of the socket; and
    wherein each of the pair of holes in the heat sink is adapted to receive a different one of the side members of the spring clip.

2. The heat transfer apparatus as recited in claim 1, wherein the PGA device comprises a substrate having a substantially flat upper surface opposite the socket, and wherein the integrated circuit of the PGA device is mounted upon the upper surface of the substrate such that the integrated circuit is elevationally raised above the upper surface of the substrate.

3. The heat transfer apparatus as recited in claim 2, wherein the opening comprises a first cavity dimensioned to receive the socket and the substrate of the PGA device, and wherein the first cavity has an upper wall, and wherein the opening further comprises a second cavity in the upper wall of the first cavity, and wherein the second cavity is dimensioned to receive the integrated circuit.

4. The heat transfer apparatus as recited in claim 3, further comprising a thermal interface layer positioned between the integrated circuit and an upper wall of the second cavity.

5. The heat transfer apparatus as recited in claim 3, further comprising a thermal interface layer positioned between a region of the upper surface of the substrate surrounding the integrated circuit and an adjoining portion of the upper wall of the first cavity.

6. The heat transfer apparatus as recited in claim 3, further comprising a thermal interface layer positioned about the socket between the lip of the heat sink and the surface of the PCB.

7. The heat transfer apparatus as recited in claim 1, wherein the holes in the heat sink are separated by a distance equal to a distance between the latching projections of the socket.

8. The heat transfer apparatus as recited in claim 1, wherein the spring clip further comprises a joining member connected between the two side members, and wherein the joining member is made from a resilient material.

9. The heat transfer apparatus as recited in claim 8, wherein the joining member is made from spring steel.

10. The heat transfer apparatus as recited in claim 8, wherein the joining member has two ends and a bowed center section between the two ends, and wherein the two ends of the joining member are substantially parallel to one another.

11. The heat transfer apparatus as recited in claim 10, wherein each side member has an upper end an a lower end, and wherein one of the two ends of the joining member is connected to the upper end of one of the side members, and wherein the other end of the joining member is connected to the upper end of the other side member, and wherein the center section of the joining member is bowed toward the lower ends of the side members such that the spring clip is substantially "M"-shaped.

12. The heat transfer apparatus as recited in claim 11, wherein each side member has a hole in the lower end dimensioned to allow a corresponding one of the latching projections of the socket to pass therethrough.

13. The heat transfer apparatus as recited in claim 12, wherein the latching projections of the socket are substantially rectangular.

14. The heat transfer apparatus as recited in claim 12, wherein the spring clip is formed from a single piece of resilient material.

15. The heat transfer apparatus as recited in claim 14, wherein the spring clip is formed from a single piece of spring steel.

16. The heat transfer apparatus as recited in claim 14, wherein the spring clip has sharp bends at interfaces between the side members and the joining member.

17. The heat transfer apparatus as recited in claim 1, wherein the heat sink is made from a metal.

18. The heat transfer apparatus as recited in claim 1, wherein the heat sink includes multiple structures extending from the upper surface.

19. A heat transfer apparatus for coupling to a pin grid array (PGA) device including an integrated circuit and mounted within a socket, wherein the PGA device comprises a substrate having a substantially flat upper surface opposite the socket, and wherein the integrated circuit of the PGA device is mounted upon the upper surface of the substrate such that the integrated circuit is elevationally raised above the upper surface of the substrate, and wherein the socket is mounted upon a surface of a printed circuit board (PCB) and comprises latching projections extending from opposite side surfaces, the heat transfer apparatus comprising:
    a thermally conductive heat sink, comprising:
        a first cavity in an underside surface of the heat sink, wherein the first cavity is dimensioned to receive the socket and the substrate of the PGA device, and wherein the first cavity has an upper wall;
        a second cavity in the upper wall of the first cavity, wherein the second cavity is dimensioned to receive the integrated circuit;
        a lip surrounding the first cavity for thermally coupling to the PCB about the socket;
        a pair of holes extending through the heat sink from an upper surface of the heat sink into the opening;

a spring clip for holding the heat sink in place relative to the PGA device, wherein the spring clip comprises two side members, and wherein each side member is adapted for attaching to a different one of the latching projections of the socket, and wherein each side member has a hole in a lower end dimensioned to allow a corresponding one of the latching projections of the socket to pass therethrough; and wherein each of the pair of holes in the heat sink is adapted to receive a different one of the side members of the spring clip.

20. The heat transfer apparatus as recited in claim 19, further comprising a thermal interface layer positioned between the integrated circuit and an upper wall of the second cavity.

21. The heat transfer apparatus as recited in claim 19, further comprising a thermal interface layer positioned between a region of the upper surface of the substrate surrounding the integrated circuit and an adjoining portion of the upper wall of the first cavity.

22. The heat transfer apparatus as recited in claim 19, further comprising a thermal interface layer positioned about the socket between the lip of the heat sink and the surface of the PCB.

23. The heat transfer apparatus as recited in claim 19, wherein the holes in the heat sink are separated by a distance equal to a distance between the latching projections of the socket.

24. The heat transfer apparatus as recited in claim 19, wherein the spring clip further comprises a joining member connected between the two side members, and wherein the joining member is made from a resilient material.

25. The heat transfer apparatus as recited in claim 24, wherein the joining member has two ends and a bowed center section between the two ends, and wherein the two ends of the joining member are substantially parallel to one another.

26. The heat transfer apparatus as recited in claim 25, wherein each side member has an upper end opposite the lower end, and wherein one of the two ends of the joining member is connected to the upper end of one of the side members, and wherein the other end of the joining member is connected to the upper end of the other side member, and wherein the center section of the joining member is bowed toward the lower ends of the side members such that the spring clip is substantially "M"-shaped.

27. The heat transfer apparatus as recited in claim 26, wherein the spring clip is formed from a single piece of resilient material.

* * * * *